US009397419B2

(12) United States Patent
Kang et al.

(10) Patent No.: US 9,397,419 B2
(45) Date of Patent: Jul. 19, 2016

(54) SOLDERABLE ELECTRIC CONNECTOR

(71) Applicants: JOINSET CO., LTD., Ansan-si, Kyeonggi-do (KR); Sun-Ki Kim, Gunpo-si, Kyeonggi-do (KR)

(72) Inventors: Tae-Man Kang, Ansan-si (KR); Heung-Yong Shim, Ansan-si (KR); Sun-Ki Kim, Gunpo-si (KR); Yun-Heui Han, Ansan-si (KR)

(73) Assignees: Joinset Co., Ltd. (KR); Sun-Ki Kim (KR)

( * ) Notice: Subject to any disclaimer, the term of this patent is extended or adjusted under 35 U.S.C. 154(b) by 195 days.

(21) Appl. No.: 14/284,730

(22) Filed: May 22, 2014

(65) Prior Publication Data

US 2015/0072545 A1 Mar. 12, 2015

(30) Foreign Application Priority Data

Sep. 12, 2013 (KR) ........................ 10-2013-0109948
Sep. 27, 2013 (KR) ........................ 10-2013-0115006

(51) Int. Cl.
*H01R 12/00* (2006.01)
*H05K 1/00* (2006.01)
*H01R 12/53* (2011.01)
*H01R 4/48* (2006.01)
(Continued)

(52) U.S. Cl.
CPC .............. *H01R 12/53* (2013.01); *H01R 4/4818* (2013.01); *H01R 13/115* (2013.01); *H01R 13/6278* (2013.01)

(58) Field of Classification Search
CPC ...... H01R 12/526; H01R 12/57; H01R 12/53; H01R 4/4818; H01R 4/48; H01R 43/205
USPC ............... 439/41, 42, 83, 828, 834, 846, 436, 439/437, 438, 441
See application file for complete search history.

(56) References Cited

U.S. PATENT DOCUMENTS

| | | | | | |
|---|---|---|---|---|---|
| 3,976,348 | A | * | 8/1976 | Simmons | H01R 11/00 439/268 |
| RE30,277 | E | * | 5/1980 | Simmons | H01R 11/00 439/268 |
| 4,534,613 | A | * | 8/1985 | Esser | H01R 13/115 439/834 |

(Continued)

FOREIGN PATENT DOCUMENTS

| | | | |
|---|---|---|---|
| JP | 2003-323930 | A | 11/2003 |
| KR | 2001-0069895 | A | 7/2001 |

(Continued)

*Primary Examiner* — Hae Moon Hyeon
(74) *Attorney, Agent, or Firm* — Park & Associates IP Law, P. C.

(57) ABSTRACT

A solderable electric connector formed of a metal sheet as a single body includes a flat bottom portion soldered to a conductive pattern of a printed circuit board (PCB), an elastic fastening portion bent and extended from one end of the bottom portion in a longitudinal direction thereof, and a housing vertically bent and extended from one end of the bottom portion in a width direction and surrounding the elastic fastening portion. Herein, a front end of the housing is vertically bent downwards and forms a supporting plate and a penetration hole is formed in a certain location on the supporting plate. Also, a pressurizing projection projects from a top surface of the elastic fastening portion and a metal core of a wire passing through the penetration hole is pressurized between the pressurizing projection and a bottom surface of the housing and coupled therewith.

16 Claims, 7 Drawing Sheets

(51) Int. Cl.
*H01R 13/115* (2006.01)
*H01R 13/627* (2006.01)

(56) References Cited

U.S. PATENT DOCUMENTS

| | | | | | |
|---|---|---|---|---|---|
| 4,685,754 | A * | 8/1987 | Coldren | H01R 13/20 | 439/270 |
| 5,860,837 | A * | 1/1999 | Bock | H01R 4/4845 | 439/828 |
| 6,039,615 | A * | 3/2000 | Suzuki | H01R 13/113 | 439/849 |
| 7,513,793 | B2 * | 4/2009 | Horst | H01R 4/4818 | 439/427 |
| 7,837,521 | B2 * | 11/2010 | Kato | H01R 13/113 | 439/843 |
| 8,408,952 | B2 * | 4/2013 | Wu | H01R 4/4818 | 439/441 |
| 8,550,838 | B2 * | 10/2013 | Osagle | H01R 4/4818 | 439/441 |
| 8,636,523 | B2 * | 1/2014 | Nagasaki | H01R 4/2404 | 439/439 |

FOREIGN PATENT DOCUMENTS

| | | | |
|---|---|---|---|
| KR | 20-0432451 | Y1 | 11/2006 |
| KR | 10-2007-0032896 | A | 3/2007 |

* cited by examiner (A)

(B)

(C)

(A)

(B)

SOLDERABLE ELECTRIC CONNECTOR

REFERENCE TO RELATED APPLICATIONS

This application claims the priority benefit of Korean Patent Application No. 10-2013-0109948 filed on Sep. 12, 2013, and Korean Patent Application No. 10-2013-0115006 filed on Sep. 27, 2013, the entire contents of which are incorporated herein by reference.

FIELD OF THE INVENTION

The present invention relates to an electric connector, and more particularly, to a solderable electric connector, to which an electric wire is electrically connected to be directly separable, the electric connector being formed of a metal sheet as a single body and mounted on a printed circuit board to be solderable.

BACKGROUND OF THE INVENTION

In order to electrically connect conductors of various wires formed of a metal conductor of an inner core and an insulating polymer sheath covering the metal conductor to a conductive pattern of a printed circuit board (PCB), the metal conductor having a circular or tetragonal cross section inside the sheath of the wire, which will be, hereinafter, referred to as a metal core, is exposed outwards and soldered using solder while being in direct contact with the conductive pattern on the PCB or the PCB is perforated and the metal core is inserted into a hole in the PCB and soldered using solder.

As described above, a method of directly connecting a metal core of a wire to a conductive pattern of a PCB using solder has several limitations according to various structure of the PCB.

For example, since a terminal such as a cellular phone is lightened and miniaturized in size to be complicated in an inner structure and to be limited in space, a diameter of a wire used herein is very small. As a result thereof, it is difficult to directly solder a metal core of the wire having a small size to a conductive pattern on a PCB. Particularly, when a size of the conductive pattern of the PCB is small, the strength of soldering between the metal core and the conductive pattern is low.

Particularly, since the PCB has an approximately flat surface, it is difficult to solder with the metal core of the wire.

Also, since the metal core is soldered, it is difficult to attach or detach the metal core to or from the PCB and it is impossible to repetitively attach or detach the metal core using mechanical forces.

In addition, when the metal core of the wire is soldered to a thin and flexible substrate such as a flexible PCB (FPCB) used for the cellular phone, since the substrate has low mechanical strength and is flexible, a soldered portion may be easily cut off.

On the other hand, an electric connector covered with a plastic housing mounted on a PCB may be used. A general electric connector described above is configured by inserting a metal terminal into the plastic housing to be coupled or insert-molding the metal terminal into a housing molding. Accordingly, it is necessary to additionally use the plastic housing, a size of a product increases and manufacturing costs such as additional assembling costs increases.

SUMMARY OF THE INVENTION

An object of the present invention is to provide an electric connector formed of a metal sheet as a single body to be capable of being surface-mounted on a printed circuit board (PCB) through vacuum pickup and being soldered through reflow soldering.

Another object of the present invention is to provide a solderable electric connector directly connected to an opposite metal core while having mechanical strength to have reduced installation area and costs.

Still another object of the present invention is to provide an electric connector capable of being directly attached or detached to or from a plug coupled with a metal core of a wire or a plug coupled with the metal core by mechanical forces and being easily soldered.

Even another object of the present invention is to provide a solderable electric connector having a small size, being easily mass-produced, and reducing manufacturing costs.

Yet another object of the present invention is to provide a solderable electric connector having a broad bond area with a PCB and soldered to the PCB while having mechanical strength.

According to an aspect of the present invention, there is provided a solderable electric connector formed of a metal sheet as a single body. The solderable electric connector includes a flat bottom portion soldered to a conductive pattern of a printed circuit board (PCB), an elastic fastening portion bent and extended from one end of the bottom portion in a longitudinal direction thereof, and a first housing vertically bent and extended from one end of the bottom portion in a width direction and surrounding the elastic fastening portion. Herein, a front end of the first housing is vertically bent downwards and forms a supporting plate and a penetration hole is formed in a certain location on the supporting plate. Also, a pressurizing projection projects from a top surface of the elastic fastening portion and a metal core of a wire passing through the penetration hole is pressurized between the pressurizing projection and a bottom surface of the first housing and coupled therewith According to another aspect of the present invention, there is provided a surface-mountable electric connector, which is solderable and formed of a metal sheet as a single body. The surface-mountable electric connector includes a flat bottom portion soldered to a conductive pattern of a PCB, an elastic fastening portion bent and extended from one end of the bottom portion in a longitudinal direction thereof, and a housing including a first housing vertically bent and extended from one end of the bottom portion in a width direction and bent toward a top of the elastic fastening portion and a second housing vertically bent and extended from another end of the bottom portion in the width direction, bent toward the top of the elastic fastening portion, and in contact with a top surface of the first housing to be overlapped therewith. Herein, a top surface of the second housing provides a pickup area for a vacuum pickup. Also, the elastic fastening portion is formed with a fastening device, to which a plug fixed to a wire and electrically connected to a metal core of the wire is attached to be detachable.

BRIEF DESCRIPTION OF THE DRAWINGS

The above objects and other advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the attached drawings.

Figure 1:
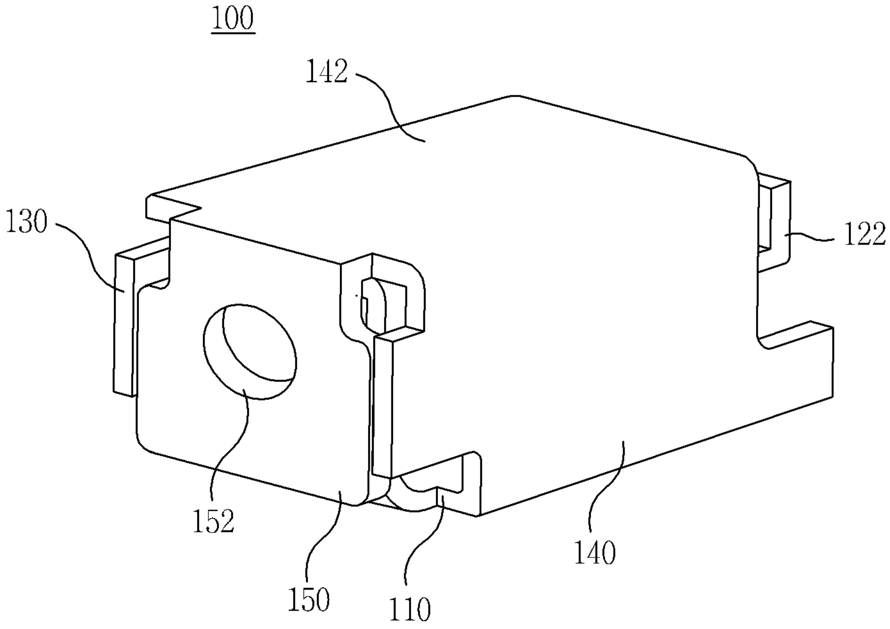
FIG. 1 is a perspective view of an electric connector according to an embodiment of the present invention.
Figure 2:
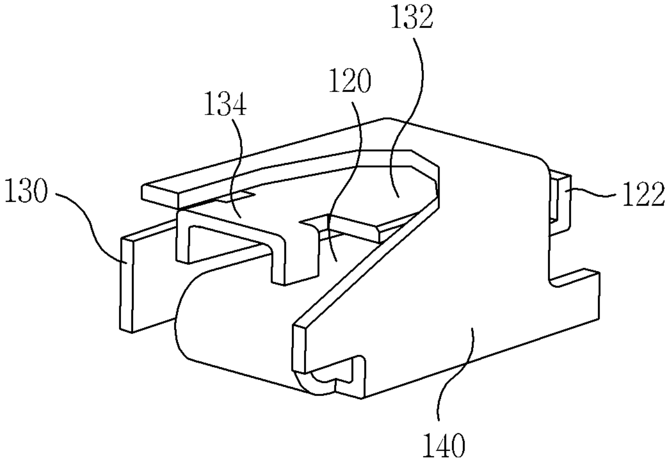
FIG. 2 is a perspective view of a partially removed second housing of FIG. 1.
Figure 3:
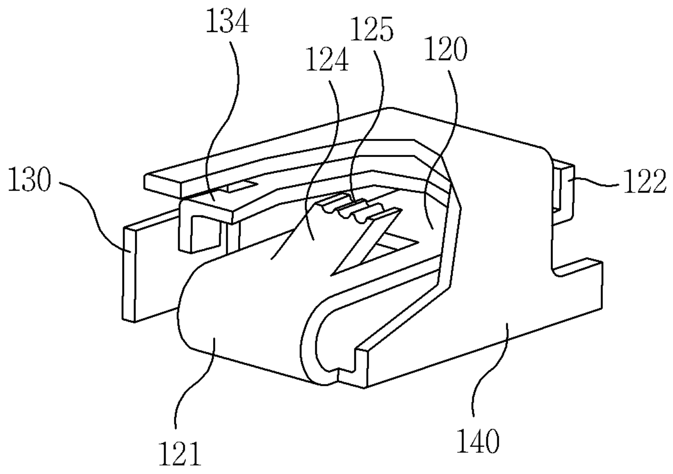
FIG. 3 is a perspective view of partially removed first and second housings of FIG. 1.
Figure 4:
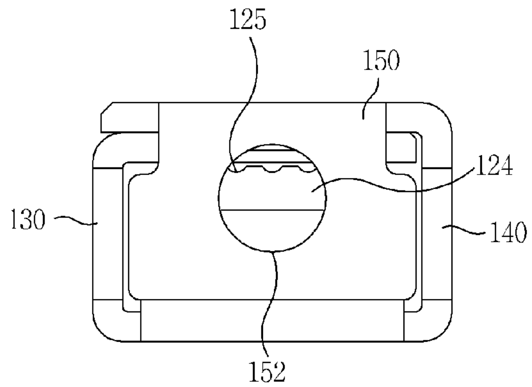
FIG. 4A is a front view of the electric connector.
FIG. 4B is a side cross-sectional view of the electric connector.
FIG. 4C is a cross-sectional view illustrating a part taken along a line A-A' shown in FIG. 4B.
Figure 4:
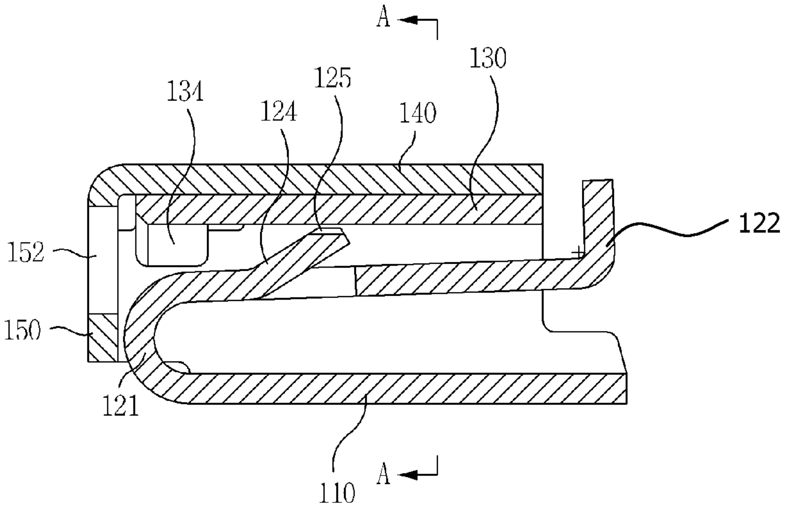
Figure 4:
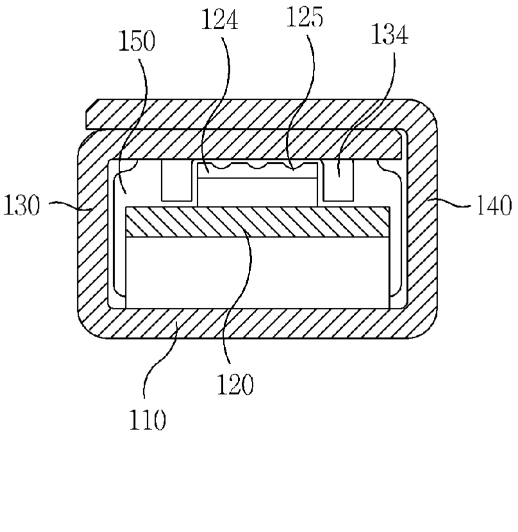
Figure 5:
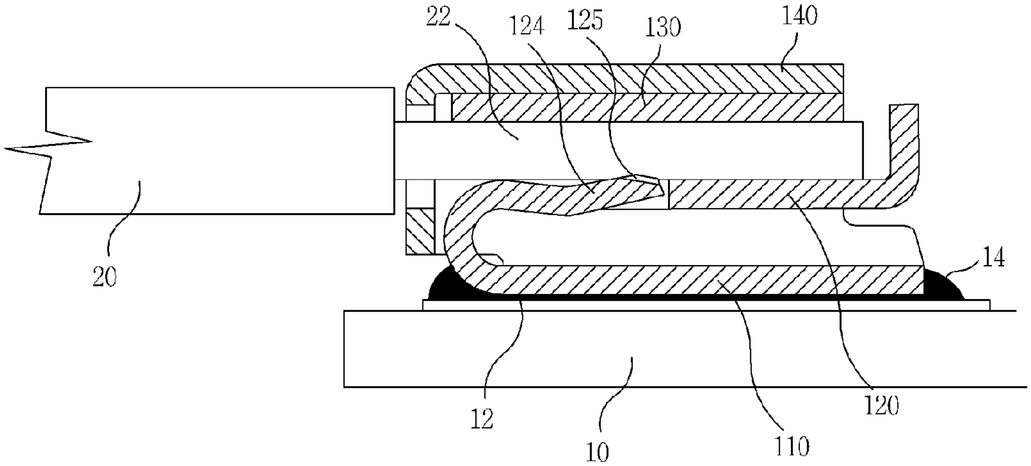
FIG. 5 is a view illustrating an example of using the electric connector.

FIG. 1 is a perspective view illustrating an electric connector 100 according to an embodiment of the present invention. FIGS. 2 and 3 are perspective views of partially removed first and second housings of FIG. 1, respectively. FIG. 4A is a front view of the electric connector 100. FIG. 4B is a side cross-sectional view of the electric connector 100. FIG. 4C is a cross-sectional view illustrating a part taken along a line A-A' shown in FIG. 4B. FIG. 5 is a view illustrating an example of using the electric connector 100.

The electric connector 100 is formed of a single body and, for example, may be manufactured using metal foil having excellent elasticity and a thickness of from about 0.08 mm to about 0.25 mm, such as stainless steel, beryllium copper, phosphor bronze, and a copper alloy, through progressive press using a press mold.

Herein, the electric connector 100 may be manufactured by pressing metal foil and then plating the metal foil with tin, silver, or gold to prevent oxidation and to easily perform reflow soldering using solder cream.

As described above, it is a general manufacturing skill to manufacture the electric connector 100 by pressing metal foil having a certain width and elasticity using a progressive mold and plating the same.

As shown in FIG. 1, the electric connector 100 has the shape of an approximate hexahedral box, which allows it to be easy to be supplied while being reeled in a career, vacuum-picked up by a vacuum pickup at a top surface thereof, and to be surface-mounted on a conductive pattern 12 of a printed circuit board (PCB) 10 at a bottom surface thereof.

A size of the electric connector 100 is not particularly limited. For example, the electric connector 100 may have a width of about 3.0 mm, a length of about 4.5 mm, and a height of about 2.0 mm.

Hereinafter, referring to FIGS. 1 to 4, respective portions of the electric connector 100 will be described in detail.

Bottom Portion 110

A bottom surface of the bottom portion 110 is formed to be flat and is soldered to the conductive pattern 12 of the PCB 10 by solder 14. For example, the bottom portion 110 is available for reflow soldering using solder cream.

As shown in FIG. 4B, the bottom surface 110 is extended backwards more than a top surface 142 of a first housing 140 to have a larger area, thereby increasing the strength of soldering.

Elastic Fastening Portion 120

The elastic fastening portion 120 is extended while being bent from one end of the bottom portion 110 in a longitudinal direction toward an opposite end interposing a bent portion 121 and forms a C-shape together with the bottom portion 110 as shown in FIG. 4B.

The elastic fastening portion 120 has elasticity due to the bent portion 121 verbatim and allows a metal core 22 of a wire to be pressurized by a pressurizing projection 124 formed with teeth 125 to be stuck therein.

Referring to FIG. 3, the pressurizing projection 124 projects from a top surface of the elastic fastening portion 120. For example, the pressurizing projection 124 may be formed by cutting a part of the elastic fastening portion 120 and pressing a bottom surface of the cut portion to project upwardly.

An end of the pressurizing projection 124 is formed with the teeth 125 in such a way that the teeth 125 are in contact with the metal core 22 of a wire to pressurize the metal core 22 as follows.

In the embodiment, a plurality of teeth 125 are formed lengthwise. However, not limited thereto, the teeth 125 may be formed widthwise and the number of the teeth 125 may be appropriately designed according to the size of the electric connector 100.

Particularly, when the teeth 125 are formed widthwise, the teeth 125 are formed to slant toward an end of the elastic fastening portion 120 to allow the metal core 22 to be surely stuck in an end of the teeth 125.

The end of the elastic fastening portion 120 is bent upwards to form a releasing lever 122. When pressing the releasing lever 122, since the elastic fastening portion 120 is pressed downwards and then the pressurizing projection 124 pressurizing the metal core 22 of the wire moves downwards, the metal core 22 may be separated from the electric connector 100.

On the other hand, although the end of the elastic fastening portion 120 is extended longitudinally to more project than the first housing 140 and second housing 130, and the releasing lever 122 is omitted, the end of the elastic fastening portion 120 may be allowed to perform the same function.

Housings 130 and 140

The housings include the first housing 140 and the second housing 130 configured to surround the elastic fastening portion 120.

The second housing 130 is vertically bent and extended from one end of the bottom portion 110 in a width direction toward a top of the elastic fastening portion 120. The first housing 140 is vertically bent and extended from another end of the bottom portion 110 in the width direction toward the top of the elastic fastening portion 120 to be in contact with a top surface 132 of the second housing 130 to be overlapped therewith.

Accordingly, a certain space is formed between a bottom surface of the second housing 130 and a top surface of the elastic fastening portion 120 and the metal core 22 of the wire is inserted therein.

The electric connector 100, overall, has a hexahedral box shape due to the first and second housings 140 and 130.

Referring to FIG. 1, a front end of the first housing 140 is vertically bent downwards to form a supporting plate 150. A penetration hole 152 is formed in a certain location of the supporting plate 150.

In the embodiment, a diameter of the penetration hole 152 has a size only to allow the metal core 22 to be inserted therein not to allow a sheath 20 of the wire to be inserted therein. However, not limited thereto, when a thickness of the sheath 20 of the wire is small, the metal core 22 is a bit exposed outwards, or the metal core 22 has a rectangular cross section, a part of the sheath 20 is allowed to be inserted into a part of the penetration hole 152, thereby supporting the sheath 20 of the wire.

The supporting plate 150 supports the metal core 22 or the sheath 20 of the wire electrically and physically connected thereto and simultaneously with allowing the metal core 22 to be inserted into the penetration hole 152 in an appointed direction.

Also, referring to FIG. 2, a front end of the second housing 130 is partially cut off at both ends in a width direction thereof and is vertically bent downwards, thereby forming a guide 134 having a reverse U shape.

A space between both sidewalls of the second housing 130 forming the guide 134 is formed to be slightly greater than the penetration hole 152 of the supporting plate 150 to guide the metal core 22 of the wire passing through the penetration hole 152 to precisely face the pressurizing projection 124.

On the other hand, in order to vacuum pick up the electric connector 100 using a vacuum pickup, the top surface 142 of the first housing 140 forms a flat pickup surface.

Referring to FIG. 5, the electric connector 100 may be supplied while being reel-taped. The electric connector 100 is picked up by the vacuum pickup, is surface-mounted on the conductive pattern 12 of the PCB 10, and is reflow-soldered by the solder 14 together with other electronic components.

As shown in FIG. 5, when the metal core 22 of the wire is inserted into the penetration hole 152 of the supporting plate 150 and the wire is pushed, the sheath 20 of the wire does not pass through the penetration hole 152 and is blocked by the supporting plate 150 and only the metal core 22 of the wire passes through the penetration hole 152.

Herein, the both sidewalls of the guide 134 prevent the metal core 22 from progressing in another direction in addition to the appointed direction and guide the metal core 22 to progress above the pressurizing projection 124.

When the wire is pressurized, a cross section of the metal core 22 pressurizes the pressurizing projection 124. As a result thereof, the pressurizing projection 124 is applied with a rotational moment and is pushed downwards while rotating.

Continuously, when the cross section of the metal core 22 passes the pressurizing projection 124 and progresses, the teeth 125 are in contact with the metal core 22 and pressurize the metal core 22 due to elastic restoration force of the pressurizing projection 124.

As a result thereof, the metal core 22 is restricted in a space between the teeth 125 and the bottom surface of the first housing 130 and firmly fixed thereto. Accordingly, the metal core 22 of the wire is electrically and physically coupled with the electric connector 100.

In this state, when the wire is pulled, an upward rotational moment is applied to the pressurizing projection 124 due to frictional forces between a surface of the metal core 22 and the teeth 125 to allow the teeth 125 to more strongly pressurize the metal core 22.

To separate the wire, when the releasing lever 122 is pressed downwards, the elastic fastening portion 120 is pressed downwards and then the pressurizing projection 124 pressurizing the metal core 22 of the wire moves downwards, thereby separating the metal core 22 from the electric connector 100.

As described above, after a metal sheet is formed as a single body through a pressing process, the electric connector 100 is reel-packaged on a carrier tape to be surface-mounted on the PCB 10 by a vacuum pickup and to be reflow-soldered using solder cream, thereby reducing manufacturing costs and being easily mounted.

Also, the electric connector 100 may be directly connected to the facing metal core 22 while having mechanical strength, thereby reducing installation space and costs of the electric connector 100.

Also, the metal core 22 and the electric connector 100 may be directly and mechanically fastened to each other. Also, the metal core 22 may be detachable from the electric connector 100 using mechanical forces.

Also, the wire may be detachable using physical forces of the electric connector 100 without an additional plastic housing. Particularly, since the metal core 22 is directly connected to the electric connector 100, it is unnecessary to couple the wire with an additional device.

Also, a soldered portion has an area having a certain size, mechanical coupling between the electric connector 10 and the PCB 10 is reliable. Particularly, when the PCB 10 is a flexible PCB (FPCB) having a small thickness and elasticity, the electric connector 100 may be more effectively used.

Figure 6:
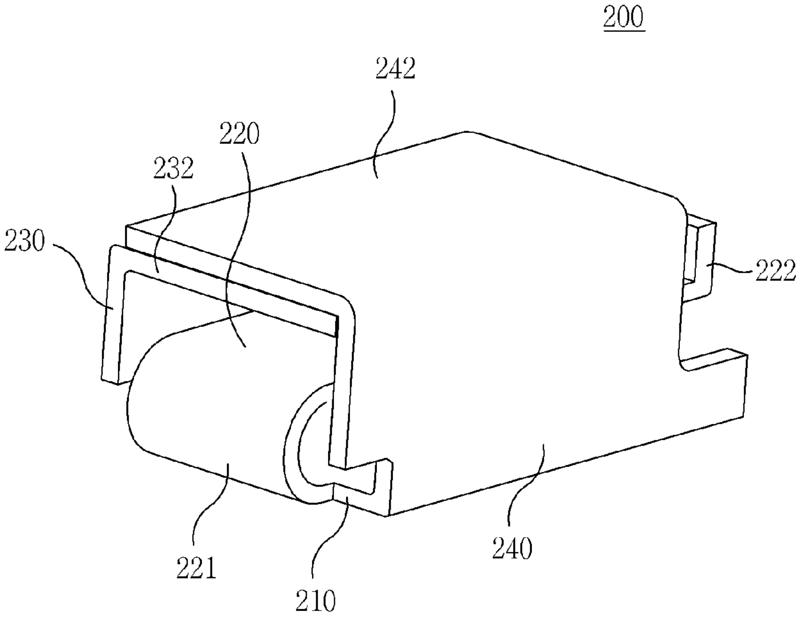
FIG. 6 is a perspective view of an electric connector according to another embodiment of the present invention.
Figure 7:
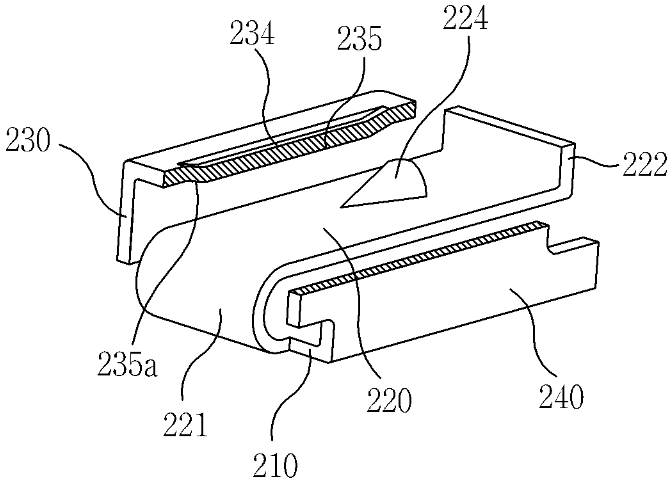
FIG. 7 is a perspective view of the electric connector of FIG. 6, which is partially removed.
Figure 8:
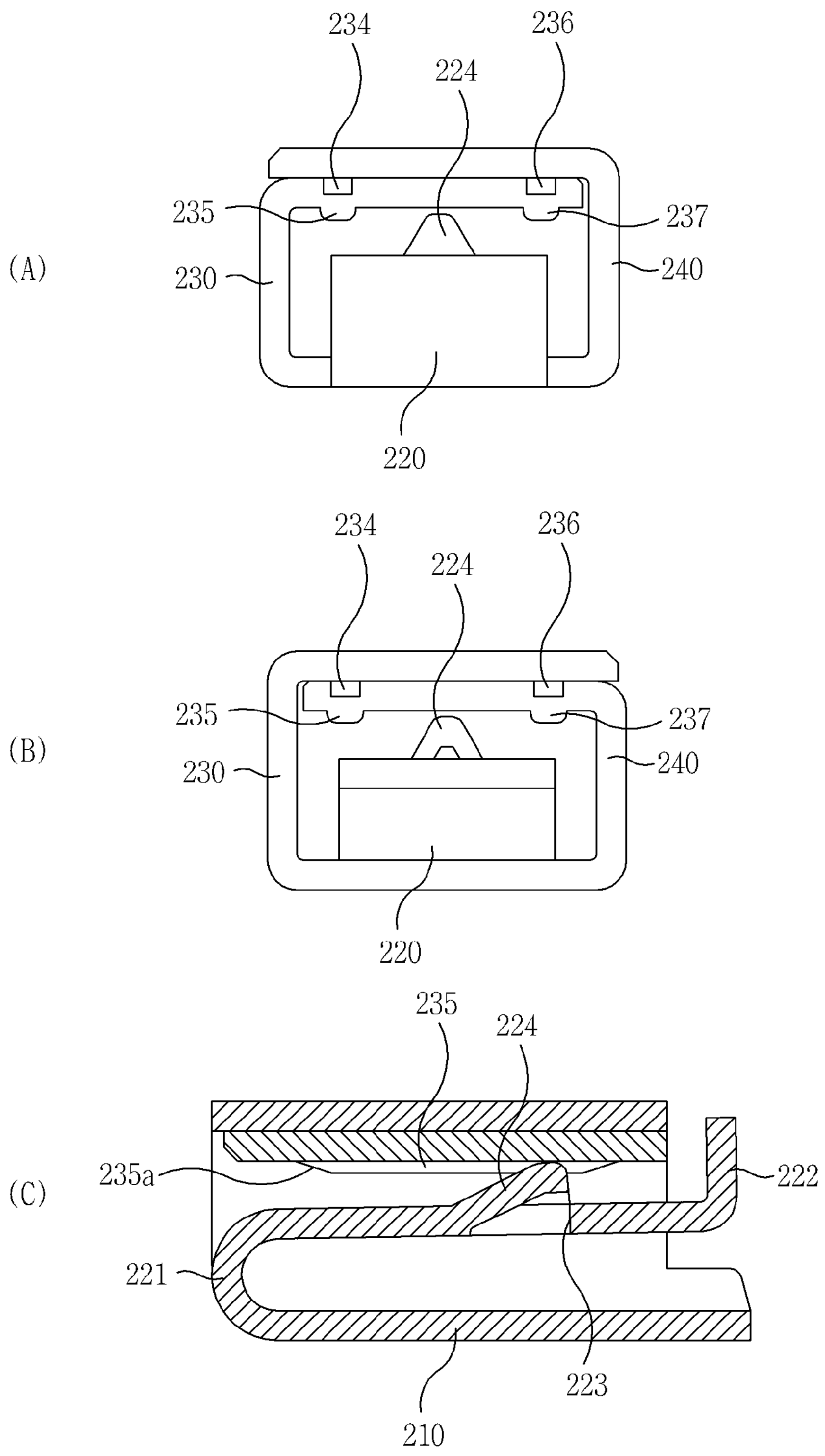
FIGS. 8A, 8B and 8C are a front view, a rear view, and a side cross-sectional view of the electric connector of FIG. 6, respectively.
Figure 9:
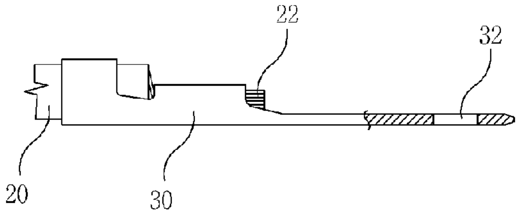
FIG. 9A is a view of a plug coupled with a wire.
FIG. 9B is a view illustrating an example of using the electric connector of FIG. 6.
Figure 9:
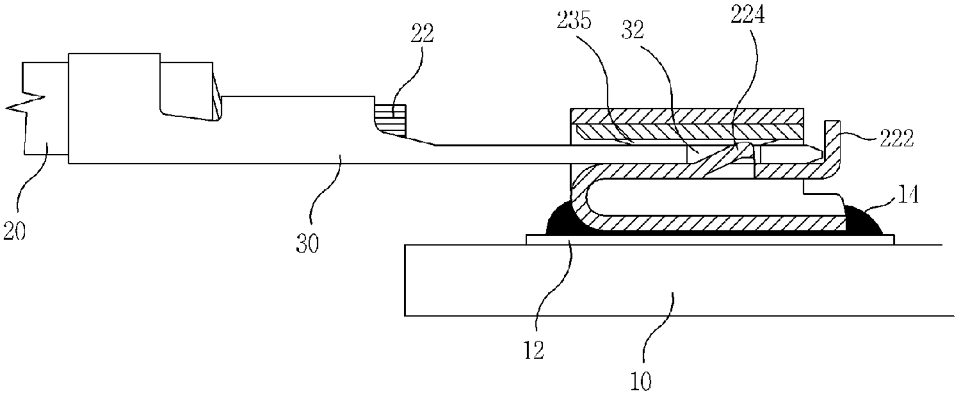

FIG. 6 is a perspective view of an electric connector 200 according to another embodiment of the present invention. FIG. 7 is a perspective view of the electric connector 200, which is partially removed. FIGS. 8A, 8B, and 8C are a front view, a rear view, and a side cross-sectional view of the electric connector 200, respectively. FIG. 9A is a view of a plug coupled with a wire. FIG. 9B is a view illustrating an example of an electric connector assembly using the electric connector 200.

As shown in FIG. 6, the electric connector 200 has the shape of an approximate hexahedral box, which allows it to be easy to be vacuum-picked up by a vacuum pickup and to be surface-mounted on a conductive pattern 12 of the PCB 10.

A size of the electric connector 200 is not particularly limited. For example, the electric connector 100 may have a width of about 3.0 mm, a length of about 4.5 mm, and a height of about 2.0 mm.

Hereinafter, referring to FIGS. 6 to 9B, respective parts of the electric connector 200 will be described in detail.

Bottom Portion 210

A bottom surface of the bottom portion 210 is formed to be flat and is soldered to the conductive pattern 12 of the PCB 10 by solder 14, for example, through reflow soldering using solder cream.

As shown in FIG. 8C, the bottom surface 210 is extended backwards more than a top surface 242 of a first housing 240 to have a larger area, thereby increasing the strength of soldering.

Elastic Fastening Portion 220

The elastic fastening portion 220 is extended while being bent from one end of the bottom portion 210 in a longitudinal direction thereof interposing a bent portion 221 therein and forms a C-shape together with the bottom portion 210 as shown in FIG. 8C.

The elastic fastening portion 220 has elasticity due to the bent portion 221 verbatim and allows a plug 30 to be fastened due to a hitching projection 224.

Herein, to allow the plug 30 fixed to an end of a wire 20 and electrically connected to the metal core 22 to be fastened, the elastic fastening portion 220 of the electric connector 200 may include any one of two elements.

As shown FIG. 7, the hitching projection 224 projecting from a top surface of the elastic fastening portion 220 may be formed. For example, the hitching projection 224 may be formed by forming a cutting line 223 by cutting off a part of the elastic fastening portion 220 in a width direction thereof and press-inserting an adjacent portion of the cutting line 223 from a bottom surface of the elastic fastening portion 220.

Also, although not shown in the drawing, different from the hitching projection 224, a hitching hole penetrating top and bottom of the elastic fastening portion 220 may be formed.

As described above, a fastening structure formable in the elastic fastening portion 220 may be the hitching projection 224 and the hitching hole. Corresponding thereto, the plug 30, as shown in FIG. 9A, may be formed with a hitching hole 32 or a hitching projection (not shown).

The end of the elastic fastening portion 220 is bent upwards to form a releasing lever 222. When pressing the releasing lever 222, the hitching projection 224 of the elastic fastening portion 220 may be separated from the hitching hole 32 of the plug 30, thereby separating the plug 30 from the electric connector 200.

On the other hand, although the end of the elastic fastening portion 220 is extended longitudinally to project more than a first housing 240 and a second housing 230 and the releasing lever 222 is omitted, the end of the elastic fastening portion 220 may be allowed to perform the same function.

Housings 230 and 240

The housings include the first housing 240 and a second housing 230 configured to surround the elastic fastening portion 220.

The second housing 230 is vertically bent and extended from one end of the bottom portion 210 in a width direction toward a top of the elastic fastening portion 220. The first housing 240 is vertically bent and extended from another end of the bottom portion 210 in the width direction toward the top of the elastic fastening portion 220 to be in contact with a top surface 232 of the second housing 230 to be overlapped therewith.

Accordingly, a certain space is formed between a bottom surface of the second housing 230 and a top surface of the elastic fastening portion 220 and the plug 30 is inserted therein.

Referring to FIGS. 8A and 8B, in a portion where the second housing 230 is overlapped with the first housing 240, a bottom surface of the second housing 230 is formed with a pair of contact guides 235 and 237 extended in a longitudinal direction to project therefrom.

According to a configuration described above, the space between the bottom surface of the second housing 230 and the top surface of the elastic fastening portion 220 substantially becomes smaller than a thickness of the plug 30 in FIG. 9A due to the contact guides 235 and 237. Since widths of the contact guides 235 and 237 are small and an area in contact with the plug 30 is small, the plug 30 is forcibly inserted due to appropriate frictional forces, thereby increasing the strength of coupling with the plug 30.

The contact guides 235 and 237, for example, may be formed by press-inserting the top surface 232 of the second housing 230. As shown in FIG. 8C, one ends or both ends of the contact guides 235 and 237 may form a taper 235*a* to allow the plug 30 to be easily inserted.

On the other hand, in order to vacuum pick up the electric connector 200 using a vacuum pickup, a top surface 242 of the first housing 240 forms a flat pickup surface. That is, since the top surface 232 of the second housing 230 is formed with press-insertion grooves 234 and 236 to form the contact guides 235 and 237 and is not appropriate for being used as a vacuum pickup surface, the top surface 242 of the first housing 240, overlapped therewith, is used as the vacuum pickup surface.

Referring to FIG. 9B, the electric connector 200 may be supplied while being reel-taped. The electric connector 100 is picked up by the vacuum pickup, is surface-mounted on the conductive pattern 12 of the PCB 10, and is reflow-soldered by solder cream together with other electronic components.

As described above, the plug 30 is fixed to an end of the wire 20 and is electrically connected to the metal core 22 through compression or soldering.

The plug 30 has a strip shape having a certain thickness, and as described above, may include the hitching hole 32 or the hitching projection corresponding to the electric connector 200. The plug 30, for example, is formed of a metal sheet as a single body and manufactured by a press.

As shown in FIG. 9B, when the plug 30 is inserted into the space between the first housing 230 and the elastic fastening portion 220 of the electric connector 200 and pressed, an end of the plug 30 is hitched by the hitching projection 224 of the elastic fastening portion 220 and then bent downwards due to the elasticity of the elastic fastening portion 220, thereby pressing downwards the hitching projection 224.

Herein, when the plug 30 is continuously inserted and the hitching projection 224 faces the hitching hole 32, the hitching projection 224 pressed downwards is inserted into the hitching hole 32 due to elastic restoration forces, thereby fastening the plug 30 to the electric connector 200.

To separate the plug 30, when the releasing lever 222 is pressed downwards, the hitching projection 224 is separated from the hitching hole 32 and the plug 30 is pulled, thereby being simply separated from the electric connector 200.

As described above, after a metal sheet is formed as a single body through a pressing process, the electric connector 200 is reel-packaged on a carrier tape to be surface-mounted on the PCB 10 by a vacuum pickup and to be reflow-soldered using solder cream, thereby reducing manufacturing costs and being easily mounted.

Also, the plug 30 attached to the facing wire may be detachable using physical forces of the electric connector 200 without an additional plastic housing.

Also, a soldered portion has an area having a certain size, mechanical coupling between the electric connector 200 and the PCB 10 is reliable. Particularly, when the PCB 10 is an FPCB having a small thickness and elasticity, the electric connector 200 may be more effectively used.

According to the embodiments, an electric connector is formed of a metal sheet as a single body to have excellent electric conductivity and to allow a bottom surface and a top surface to be flat, thereby being easily surface-mounted by a vacuum pickup and being easily soldered through reflow soldering.

Also, the electric connector is directly connected to an opposite metal core while having mechanical strength, thereby reducing installation space and costs.

Also, the connector bonded to a PCB by soldering is easily and directly attach or detach to or from a metal core of a wire or a plug coupled with the metal core through mechanical forces.

Also, it is possible to manufacture a metal sheet using a press without an additional plastic housing, a size thereof is small and mass production is easily performed, thereby reducing manufacturing costs.

Also, since a bottom surface of the connector forms a flat surface having a certain area, the connector may be connected with more excellent mechanical strength than being connected to a small area of a substrate through soldering.

While the present invention has been described in detail, it should be understood that various changes, substitutions and alterations can be made hereto without departing from the spirit and scope of the invention as defined by the appended claims.

What is claimed is:

1. A solderable electric connector formed of a metal sheet as a single body, the electric connector comprising:

a flat bottom portion soldered to a conductive pattern of a printed circuit board (PCB);

an elastic fastening portion bent and extended from one end of the bottom portion in a longitudinal direction thereof toward an opposite end of the bottom portion, and forming a C-shape together with the bottom portion; and a first housing vertically bent and extended from one end of the bottom portion in a width direction and surrounding the elastic fastening portion, wherein a front end of the first housing is vertically bent downwards and forms a supporting plate and a penetration hole is formed on the supporting plate, and wherein a pressurizing projection projects from a top surface of the elastic fastening portion and a metal core of a wire passing through the penetration hole is pressurized between the pressurizing projection and a bottom surface of the first housing and coupled therewith.

2. The solderable electric connector of claim 1, further comprising a second housing vertically bent and extended from another end of the bottom portion in the width direction, bent toward a top of the elastic fastening portion, and in contact with the bottom surface of the first housing to be overlapped therewith, wherein the metal core of the wire passing through the penetration hole is pressurized between the pressurizing projection and a bottom surface of the second housing.

3. The solderable electric connector of claim 1, wherein the pressurizing projection is formed by cutting off a part of the elastic fastening portion and pressing the cut portion to project in an upward direction, and wherein an end of the pressurizing projection includes one or more teeth in contact with the metal core of the wire.

4. The solderable electric connector of claim 1, wherein a top surface of the first housing provides a pickup area for a vacuum pickup.

5. The solderable electric connector of claim 4, wherein the solderable electric connector is reel-taped to be surface-mounted on the conductive pattern by vacuum picking up on the pickup area and to be reflow-soldered thereto.

6. The solderable electric connector of claim 2, wherein a front end of the second housing is partially cut off at both ends in a width direction and vertically bent downwards to form a guide having a reverse U shape, and wherein a space between sidewalls of the guide is formed to be greater than the penetration hole of the supporting plate.

7. The solderable electric connector of claim 1, wherein a diameter of the penetration hole is formed only to allow the metal core of the wire to pass therethrough.

8. A surface-mountable electric connector, which is solderable and formed of a metal sheet as a single body, the electric connector comprising:

a flat bottom portion soldered to a conductive pattern of a PCB;

an elastic fastening portion bent and extended from one end of the bottom portion in a longitudinal direction thereof toward an opposite end of the bottom portion, and forming a C-shape together with the bottom portion; and a housing comprising a first housing vertically bent and extended from one end of the bottom portion in a width direction and bent toward a top of the elastic fastening portion and a second housing vertically bent and extended from another end of the bottom portion in the width direction, bent toward the top of the elastic fastening portion, and in contact with a bottom surface of the first housing to be overlapped therewith, wherein a top surface of the first housing provides a pickup area for a vacuum pickup, and wherein the elastic fastening portion includes a fastening device, to which a plug fixed to a wire and electrically connected to a metal core of the wire, is detachably attached.

9. The surface-mountable electric connector of claim 8, wherein a pair of contact guides extended in the longitudinal direction project from a bottom surface of the second housing, on which the first housing is overlapped with the second housing.

10. The surface-mountable electric connector of claim 9, wherein the contact guide is formed by press-inserting the top surface of the second housing.

11. The surface-mountable electric connector of claim 9, wherein both ends of the contact guide are tapered.

12. The surface-mountable electric connector of claim 8, wherein the fastening configuration is one of a hitching hole formed in the elastic fastening portion and a hitching projection projecting from the elastic fastening portion toward the first housing.

13. The surface-mountable electric connector of claim 12, wherein the hitching projection is formed by cutting off a part of the elastic fastening portion in the width direction and press-inserting an adjacent portion to a cutting line from a bottom surface of the elastic fastening portion.

14. The surface-mountable electric connector of claim 8, wherein the electric connector is reel-taped to be surface-mounted on the conductive pattern by picking up on the pickup area and reflow-soldered thereto.

15. An electric connector assembly comprising:

an arm connector comprising a flat bottom portion soldered to a conductive pattern of a PCB, an elastic fastening portion bent and extended from one end of the bottom portion in a longitudinal direction thereof toward an opposite end of the bottom portion, and forming a C-shape together with the bottom portion, the elastic fastening portion including a fastening device, and a housing comprising a first housing vertically bent and extended from one end of the bottom portion in a width direction and bent toward a top of the elastic fastening portion and a second housing vertically bent and extended from another end of the bottom portion in the width direction, bent toward the top of the elastic fastening portion, and in contact with a tap bottom surface of the first housing to be overlapped therewith; and a plug formed of a metal sheet as a single body, fixed to a wire, and electrically connected to a metal core of the wire, wherein the plug is inserted into the arm connector and is detachably coupled with the fastening device.

16. The electric connector assembly of claim 15, wherein the fastening device is one of a hitching hole formed in the elastic fastening device and a hitching projection projecting from the elastic fastening portion toward the first housing, and wherein the plug is formed with one of a hitching projection and a hitching hole corresponding to the hitching hole and the hitching projection of the fastening device.

* * * * *